US008089138B2

(12) United States Patent
Imada et al.

(10) Patent No.: US 8,089,138 B2
(45) Date of Patent: Jan. 3, 2012

(54) SURFACE-HYDROPHOBICIZED FILM, MATERIAL FOR FORMATION OF SURFACE-HYDROPHOBICIZED FILM, WIRING LAYER, SEMICONDUCTOR DEVICE AND PROCESS FOR PRODUCING SEMICONDUCTOR DEVICE

(75) Inventors: Tadahiro Imada, Kawasaki (JP); Yoshihiro Nakata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 217 days.

(21) Appl. No.: 12/545,596

(22) Filed: Aug. 21, 2009

(65) Prior Publication Data
US 2009/0309196 A1    Dec. 17, 2009

Related U.S. Application Data

(63) Continuation of application No. PCT/JP2007/000228, filed on Mar. 15, 2007.

(51) Int. Cl.
*H01L 29/06* (2006.01)
*H01L 21/31* (2006.01)
*H05K 1/03* (2006.01)
*C09D 5/00* (2006.01)
*C07F 7/08* (2006.01)

(52) U.S. Cl. ........... 257/632; 257/E29.007; 257/E21.24; 556/463; 174/256; 438/778

(58) Field of Classification Search ................... 257/632; H01L 21/312
See application file for complete search history.

(56) References Cited

U.S. PATENT DOCUMENTS

| 6,770,572 | B1 | 8/2004 | Wu et al. |
| 7,029,826 | B2 | 4/2006 | Hacker et al. |
| 2004/0046198 | A1* | 3/2004 | Joshi et al. ..................... 257/300 |
| 2006/0040110 | A1 | 2/2006 | Kohmura et al. |
| 2006/0078827 | A1* | 4/2006 | Hacker et al. .................. 430/311 |
| 2007/0190735 | A1 | 8/2007 | Hacker et al. |

FOREIGN PATENT DOCUMENTS

JP    06-267946 A    9/1994
(Continued)

OTHER PUBLICATIONS

International Search Report of PCT/JP2007/000228, Mailing Date of Jun. 12, 2007.
Chinese Office Action dated Jul. 13, 2010, issued in corresponding Chinese Patent Application No. 200780052178.9.
(Continued)

*Primary Examiner* — Jarrett Stark
*Assistant Examiner* — Lawrence Tynes, Jr.
(74) *Attorney, Agent, or Firm* — Westerman, Hattori, Daniels & Adrian, LLP

(57) ABSTRACT

A surface-hydrophobicized film is provided which is in contact with an insulating film, and has a higher hydrophobicity than the insulating film at the time of the contact, and which is in contact, on an opposite side of the surface-hydrophobicized film, with wiring, and contains at least one atom selected from the group consisting of sulfur atoms, phosphorus atoms and nitrogen atoms. Semiconductor devices with wiring layers having a low leakage current, a high EM resistance and a high TDDB resistance can be manufactured by using the film.

8 Claims, 12 Drawing Sheets

STEP 1

STEP 2

STEP 3

FOREIGN PATENT DOCUMENTS

| | | |
|---|---|---|
| JP | 2004-511896 A | 4/2004 |
| JP | 2004-513503 A | 4/2004 |
| JP | 2004-292304 A | 10/2004 |
| JP | 2007-035705 A | 2/2007 |
| JP | 2007-053300 A | 3/2007 |
| WO | 00/44036 A1 | 7/2000 |
| WO | 02/01621 A2 | 1/2002 |

OTHER PUBLICATIONS

Supplementary European Search Report dated Nov. 30, 2010, issued in corresponding European Patent Application No. 07736885.0.

Korean Office Action dated May 16, 2011, issued in corresponding Korean Patenrt Application No. 10-2009-7019185.

* cited by examiner

STEP 1

STEP 2

STEP 3

STEP 4

STEP 5

STEP 6

STEP 7

STEP 8

STEP 9

STEP 13

STEP 14

STEP 15

STEP 16

STEP 17

STEP 18

SURFACE-HYDROPHOBICIZED FILM, MATERIAL FOR FORMATION OF SURFACE-HYDROPHOBICIZED FILM, WIRING LAYER, SEMICONDUCTOR DEVICE AND PROCESS FOR PRODUCING SEMICONDUCTOR DEVICE

CROSS REFERENCE TO RELATED APPLICATIONS

This application is a continuation of International_Application No. PCT/JP2007/000228, filed on Mar. 15, 2007, now pending, herein incorporated by reference.

TECHNICAL FIELD

The present invention relates to a wiring layer having a low leakage current, a high electromigration (EM) resistance and a high time-dependent dielectric breakdown (TDDB) resistance.

BACKGROUND ART

Although increases in power consumption due to leakage currents in wiring layer insulating films have hitherto been known, in generations of semiconductor devices having line spacings greater than 1 μm, the influence of such leakage currents on the overall device has been small. However, at line spacings of 1 μm or below, owing to the narrower spacing between lines and the increase in the scale of the wiring, such leakage currents have a greater influence on power consumption. In particular, as circuits come to be formed at line spacings of 0.1 μm or below, the leakage current between lines will exert a large influence on the characteristics and life of the device.

Wiring in a semiconductor device may be formed by the damascene process in which, first, trenches in the shape of the wiring are formed in an insulating film by etching, following which copper lines are formed in the trenches by plating. However, in this damascene process, because the insulating film invariably incurs damage during etching, the increase in hydrophilicity due to the damage that arises at the interior of the insulating film leads to such effects as an increase in the leakage current and a deterioration in TDDB characteristics, which are major factors in lowering yield and reliability in semiconductor production. It is assumed that this problem will become increasingly severe with the formation of circuits at line spacings of 0.1 μm or below.

In view of the above, there exists a need either to suppress damage during etching of the insulating layer when forming the wiring trenches or to carry out surface treatment to reduce the leakage current after etching.

Surface treatment to hold down the increase in hydrophilicity due to etching damage may include hydrophobicizing the wiring trenches after etching. For example, by using a method in which the etched surface of a silica-based film is hydrophobicized (see Patent Documents 1 to 4) or the like, moisture adsorption to the surface due to etching damage can be reduced, thus making it possible to minimize a deterioration in characteristics due to moisture, such as a rise in the dielectric constant.

Patent Document 1: Japanese Patent Application Laid-open No. H6-267946 (Claims)
Patent Document 2: Japanese Translation of PCT Application No. 2004-511896 (Claims)
Patent Document 3: Japanese Translation of PCT Application No. 2004-513503 (Claims)
Patent Document 4: Japanese Patent Application Laid-open No. 2004-292304 (Claims)

DISCLOSURE OF THE INVENTION

Problems to be Solved

However, it has been found that with the above approach, when reliability tests such as EM tests are carried out, the required characteristics are not achieved. Hence, further improvements are needed to enhance reliability.

It is therefore an object of the present invention to provide art for minimizing the influence of damage when the insulating layer is etched to form wiring trenches. Further objects and advantages of the invention will become apparent from the following description.

According to one aspect, the present invention provides a surface-hydrophobicized film which is in contact with an insulating film, and has a higher hydrophobicity than the insulating film at the time of the contact, and which is in contact, on an opposite side of the surface-hydrophobicized film, with wiring, and contains at least one atom selected from the group consisting of sulfur atoms, phosphorus atoms and nitrogen atoms.

By using the surface-hydrophobicized film according to this aspect of the present invention, a wiring layer having a low leakage current, a high EM resistance and a high TDDB resistance can be obtained, thus making it possible to manufacture a semiconductor device having a low power consumption and a high reliability.

It is preferable that the total concentration of the sulfur atoms, phosphorus atoms and nitrogen atoms in the surface-hydrophobicized film be higher than the total concentration of sulfur atoms, phosphorus atoms and nitrogen atoms in the insulating film; that the surface-hydrophobicized film be provided following treatment that is accompanied by damage to the insulating film; that the total concentration of sulfur atoms, phosphorus atoms and nitrogen atoms in the surface-hydrophobicized film, expressed in terms of the atomic composition, be in a range of from 1 to 10 atom %; that the surface-hydrophobicized film have a SiO skeleton; that the surface-hydrophobicized film have an average thickness in a range of from 0.1 to 50 nm; and that the insulating film be a low-k insulating film having a specific dielectric constant of 2.7 or less, and especially a low-k insulating film having a specific dielectric constant of 2.5 or less.

According to another aspect, the present invention provides a material for forming a surface-hydrophobicized film which is in contact with an insulating film, and has a higher hydrophobicity than the insulating film at the time of the contact, and which is in contact, on an opposite side of the surface-hydrophobicized film, with wiring and contains at least one atom selected from the group consisting of sulfur atoms, phosphorus atoms and nitrogen atoms. The material includes a silicon compound that satisfies at least one of a condition of having an average molecular weight of 1000 or less and a condition of having 20 or fewer silicon atoms per molecule.

By using the surface-hydrophobicized film-forming material of this aspect of the invention, a wiring layer having a low leakage current, a high EM resistance and a high TDDB resistance can be obtained, enabling semiconductor devices having a low power consumption and a high reliability to be manufactured.

It is preferable that the aforementioned surface-hydrophobicized film be provided following treatment that is accompanied by damage to the insulating film; that the silicon compound be selected from the group consisting of organosilanes, organosilane hydrolyzates, organosilane condensates, and mixtures thereof; that the surface-hydrophobicized film-forming material include a solvent that is a substance identical to a component present in the product obtained by hydrolyzing the organosilane; and that the organosilane include at least one compound represented by any of formulas (2) to (4) below, and optionally includes a compound represented by formula (1) below:

$$Si(OR^7)_4 \tag{1}$$

$$R^1Si(OR^8)_3 \tag{2}$$

$$R^2R^3Si(OR^9)_2 \tag{3}$$

$$R^4R^5R^6SiOR^{10} \tag{4},$$

(where $R^1$ to $R^{10}$ are each independently hydrogen or a group comprising a group selected from the class consisting of $C_{1-20}$ alkyls which may be substituted, $C_{2-20}$ alkenyls, alkynyls, alkylcarbonyls, alkenylalkyls and alkynylalkyls all of which may be substituted, and $C_{6-20}$ aryls which may be substituted, with the proviso that if any of $R^1$ to $R^6$ is included in the at least one compound, the at least one of $R^1$ to $R^6$ contains at least one atom selected from the group consisting of sulfur atoms, phosphorus atoms and nitrogen atoms).

According to another aspect, the present invention provides the foregoing surface-hydrophobicized film prepared by using the above-mentioned surface-hydrophobicized film-forming material.

With regard to the above surface-hydrophobicized film, it is preferable that the wiring be made of copper, that the wiring have a barrier metal about the periphery thereof, and that the barrier metal include at least one element selected from the group consisting of tantalum, tungsten, titanium, manganese and nickel.

According to another aspect, the present invention provides a process for manufacturing a semiconductor device which includes: applying the surface-hydrophobicized film-forming material to contact an insulating film on a semiconductor device to form a film; and heating the applied film at a temperature of between 80° C. and 500° C. for a period of between 0.5 and 180 minutes to form a surface-hydrophobicized film.

According to this aspect of the invention, there can be obtained an insulating layer which has a low leakage current, a high EM resistance and a high TDDB resistance, thereby enabling semiconductor devices having a low power consumption and a high reliability to be manufactured.

It is preferable that the insulating film have incurred treatment which is accompanied by damage; that such application of the material be carried out by spin coating or vapor treatment; that the surface-hydrophobicized film have an average thickness in a range of between 0.1 and 50 nm; that the heat treatment following application be carried out in an oxygen-free atmosphere; that the insulating film be at least one of an interlayer dielectric film and a protective film for the interlayer dielectric film; that the treatment accompanied by damage is etching or chemical mechanical polishing; that the insulating film have a specific dielectric constant of 2.7 or less, and especially 2.5 or less; and that the insulating film be obtained by treatment which includes applying to a substrate to be worked a liquid composition containing a silicon compound prepared by hydrolyzing one or a combination of organosilanes represented by formulas (5) to (8) below in the presence of a tetraalkylammonium hydroxide so as to form a film, heat treating the film formed of applied liquid composition at a temperature of at least 80° C. but not higher than 350° C., and baking the heat-treated film at a temperature above 350° C. but not higher than 450° C.

$$Si(OR^{11})_4 \tag{5}$$

$$X^1Si(OR^{12})_3 \tag{6}$$

$$X^2X^3Si(OR^{13})_2 \tag{7}$$

$$X^4X^5X^6SiOR^{14} \tag{8}$$

(where $X^1$ to $X^6$ are each independently hydrogen, fluorine, or a group comprising a group selected from the class consisting of $C_{1-8}$ alkyls, fluorinated alkyls, aryls and vinyls, all of which may be substituted; and $R^{11}$ to $R^{14}$ are each independently a group comprising a group selected from the class consisting of $C_{1-20}$ alkyls which may be substituted, $C_{2-20}$ alkenyls, alkynyls, alkylcarbonyls, alkenylalkyls and alkynylalkyls all of which may be substituted, and $C_{6-20}$ aryls which may be substituted).

Further aspects of the present invention provide a wiring layer and a semiconductor device which include the above-described surface-hydrophobicized film, a wiring layer and a semiconductor device which are manufactured using the above-described surface-hydrophobicized film-forming material, and a semiconductor device which is manufactured by the above-described manufacturing process.

The present invention enables a wiring layer having a low leakage current, a high EM resistance and a high TDDB resistance to be obtained. This in turn enables semiconductor devices having a low power consumption and a high reliability to be manufactured.

BEST MODE FOR CARRYING OUT THE INVENTION

Figure 1:
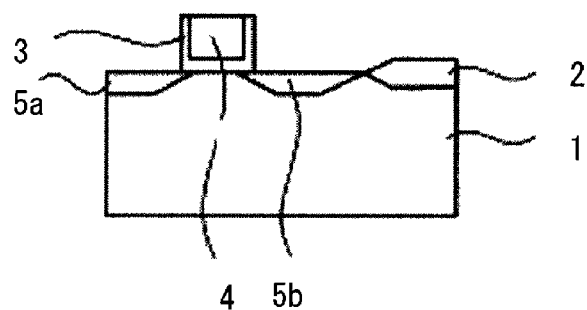
FIG. 1 is a schematic (cross-sectional) view of fabrication process in an example of multilayer wiring according to the present invention.
Figure 1:
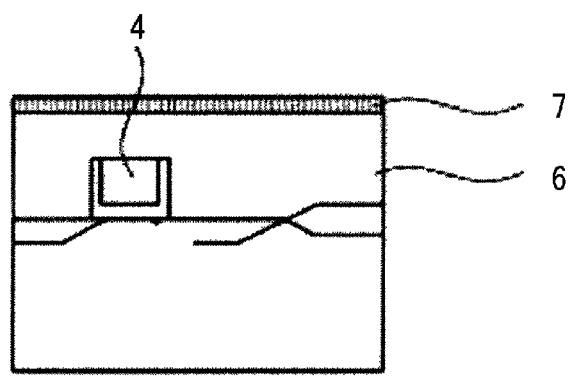
Figure 1:
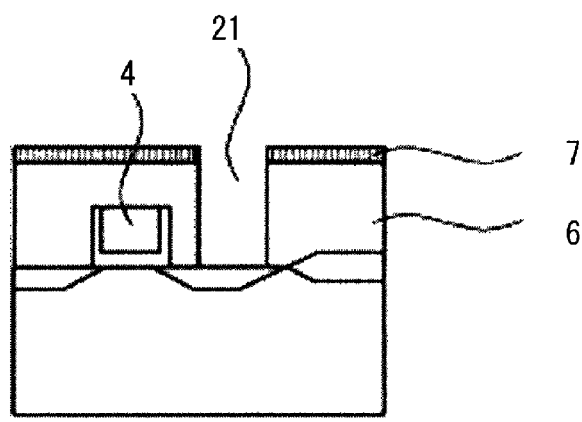
Figure 2:
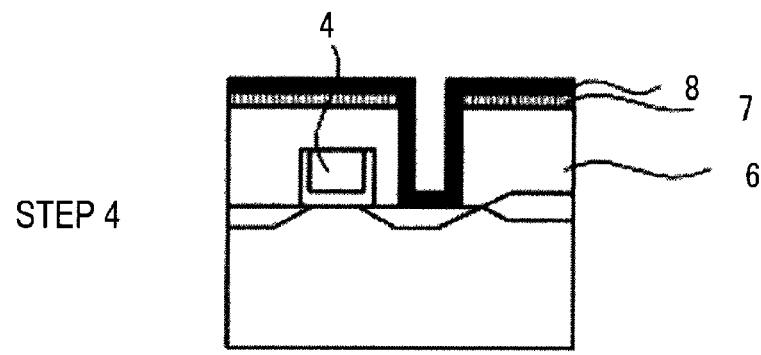
FIG. 2 is a schematic (cross-sectional) view of fabrication process in an example of multilayer wiring according to the present invention.
Figure 2:
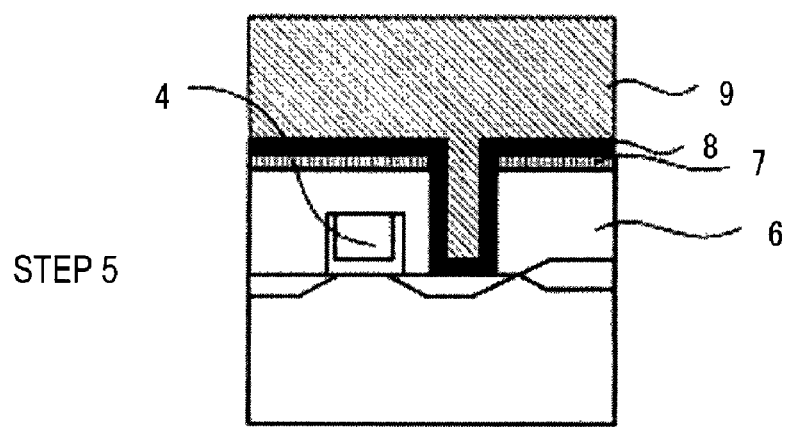
Figure 2:
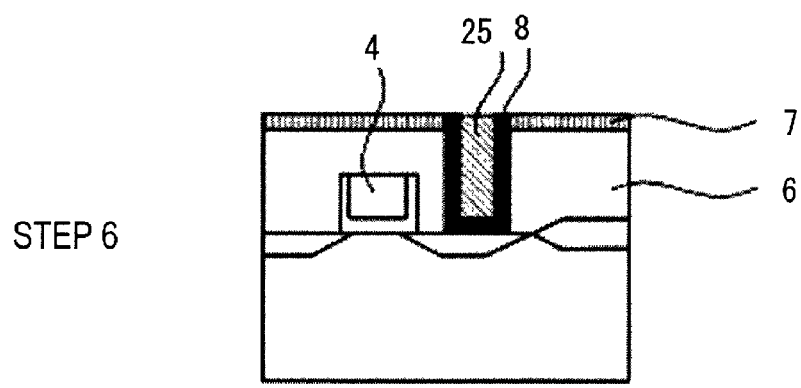
Figure 3:
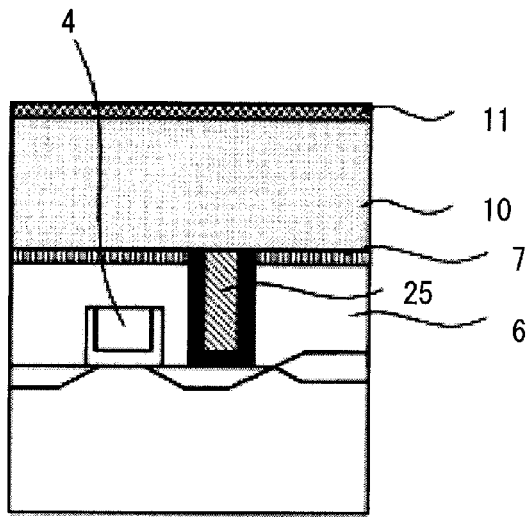
FIG. 3 is a schematic (cross-sectional) view of fabrication process in an example of multilayer wiring according to the present invention.
Figure 3:
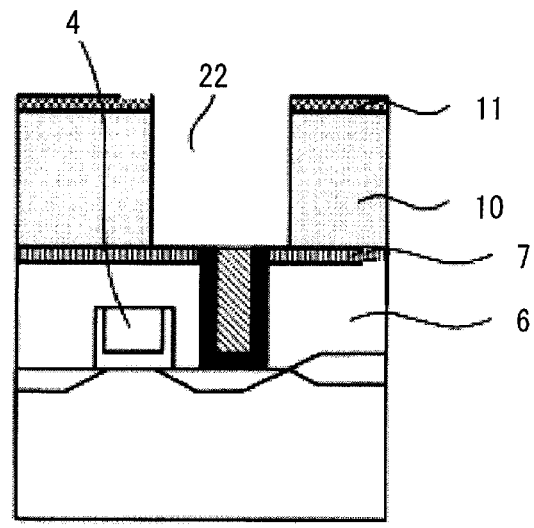
Figure 3:
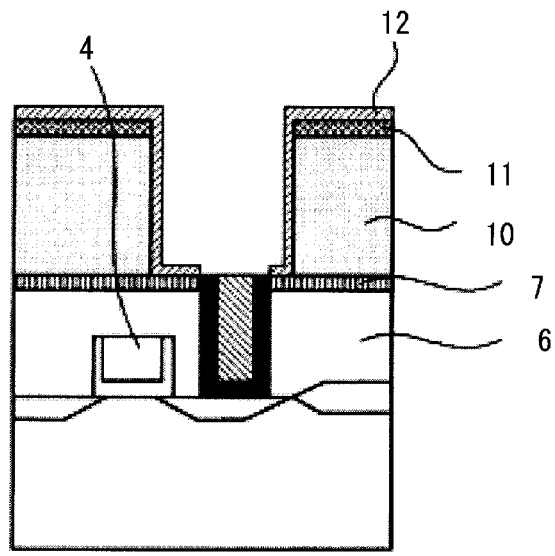
Figure 4:
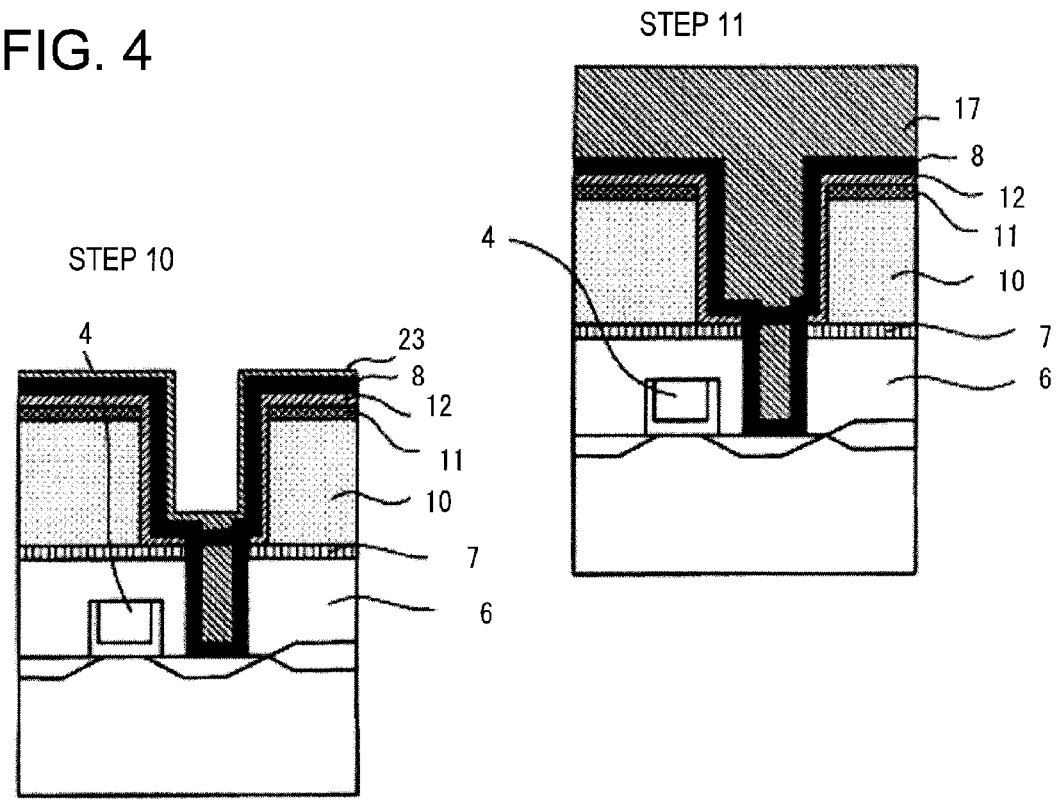
FIG. 4 is a schematic (cross-sectional) view of fabrication process in an example of multilayer wiring according to the present invention.
Figure 4:
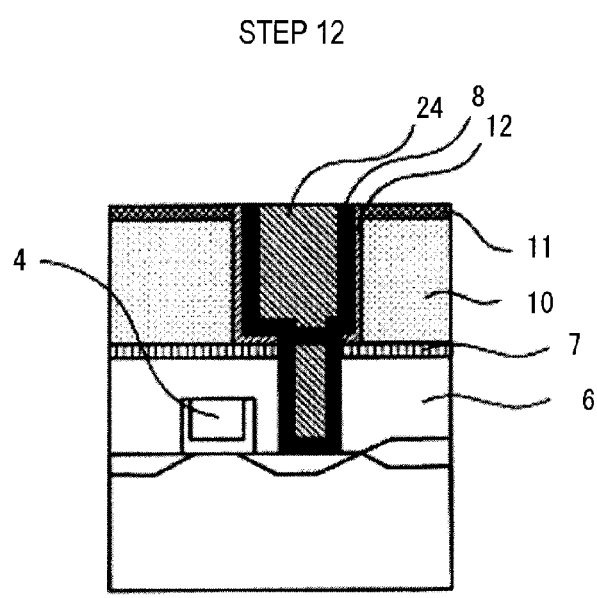
Figure 5:
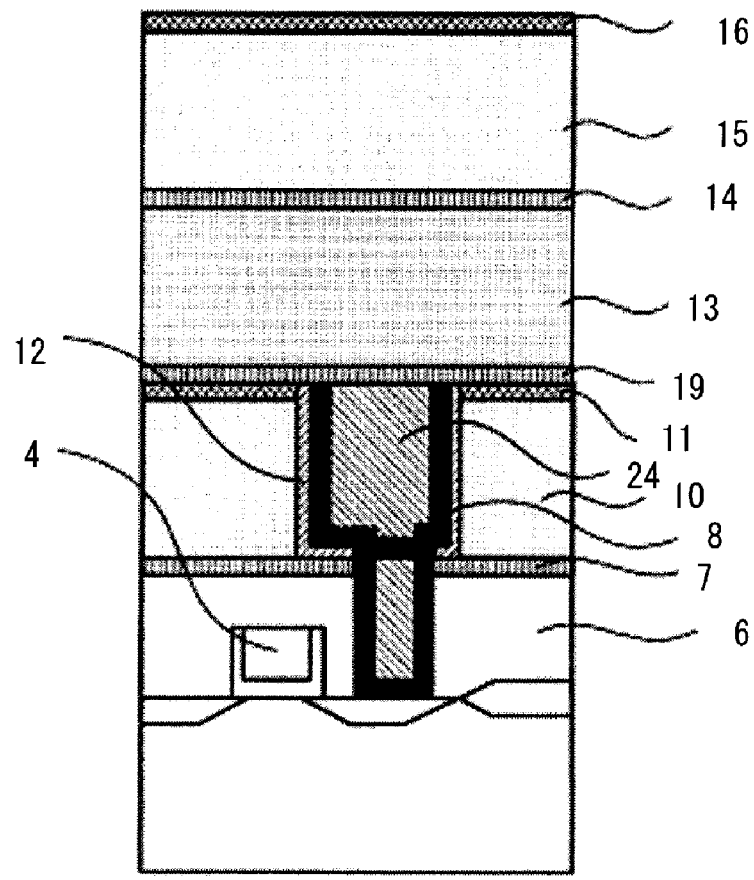
FIG. 5 is a schematic (cross-sectional) view of fabrication process in an example of multilayer wiring according to the present invention.
Figure 6:
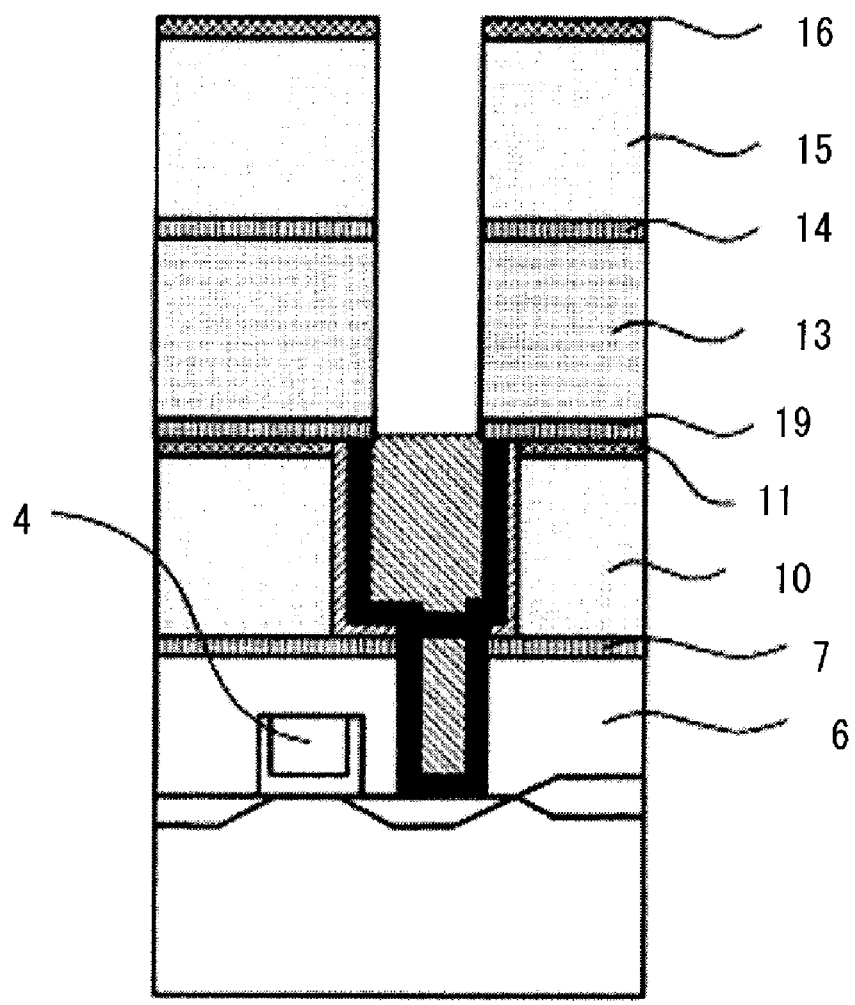
FIG. 6 is a schematic (cross-sectional) view of fabrication process in an example of multilayer wiring according to the present invention.
Figure 7:
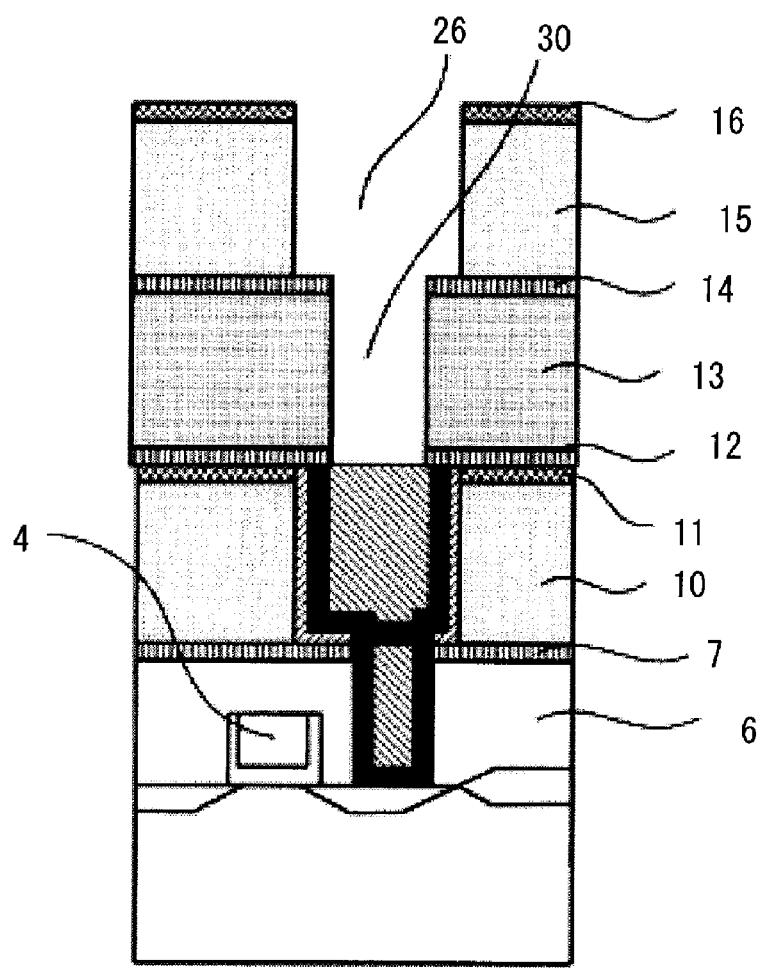
FIG. 7 is a schematic (cross-sectional) view of fabrication process in an example of multilayer wiring according to the present invention.
Figure 8:
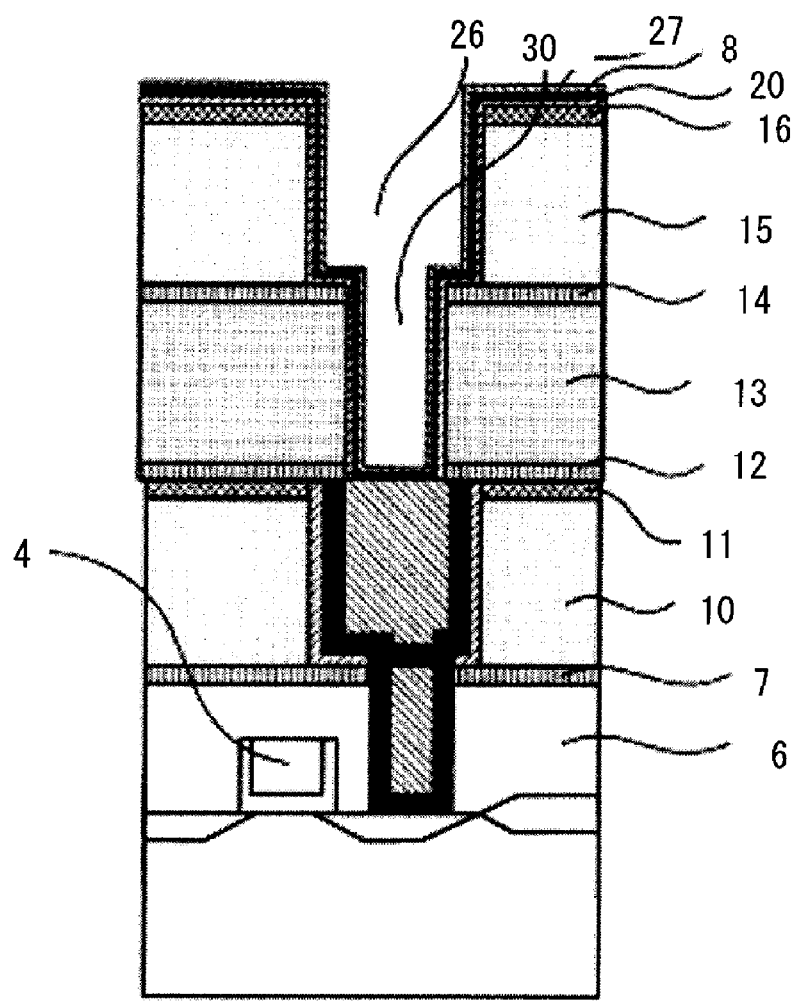
FIG. 8 is a schematic (cross-sectional) view of fabrication process in an example of multilayer wiring according to the present invention.
Figure 9:
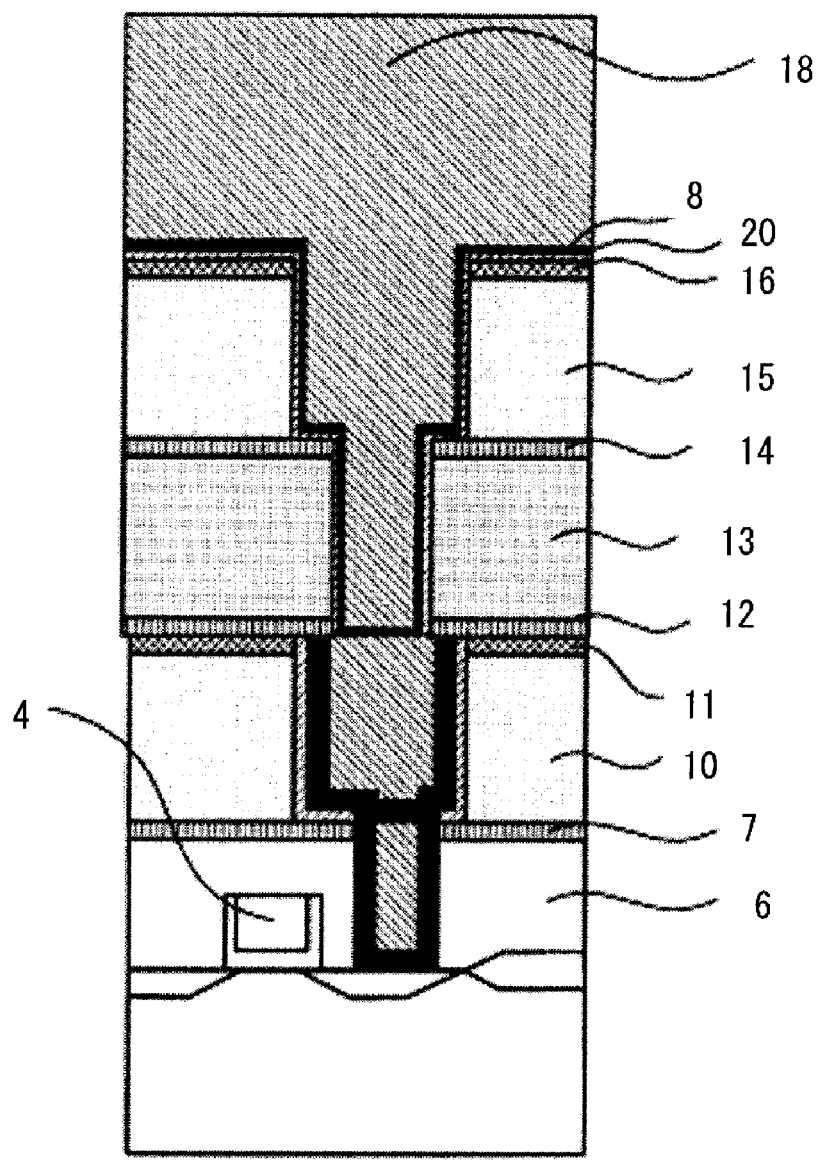
FIG. 9 is a schematic (cross-sectional) view of fabrication process in an example of multilayer wiring.
Figure 10:
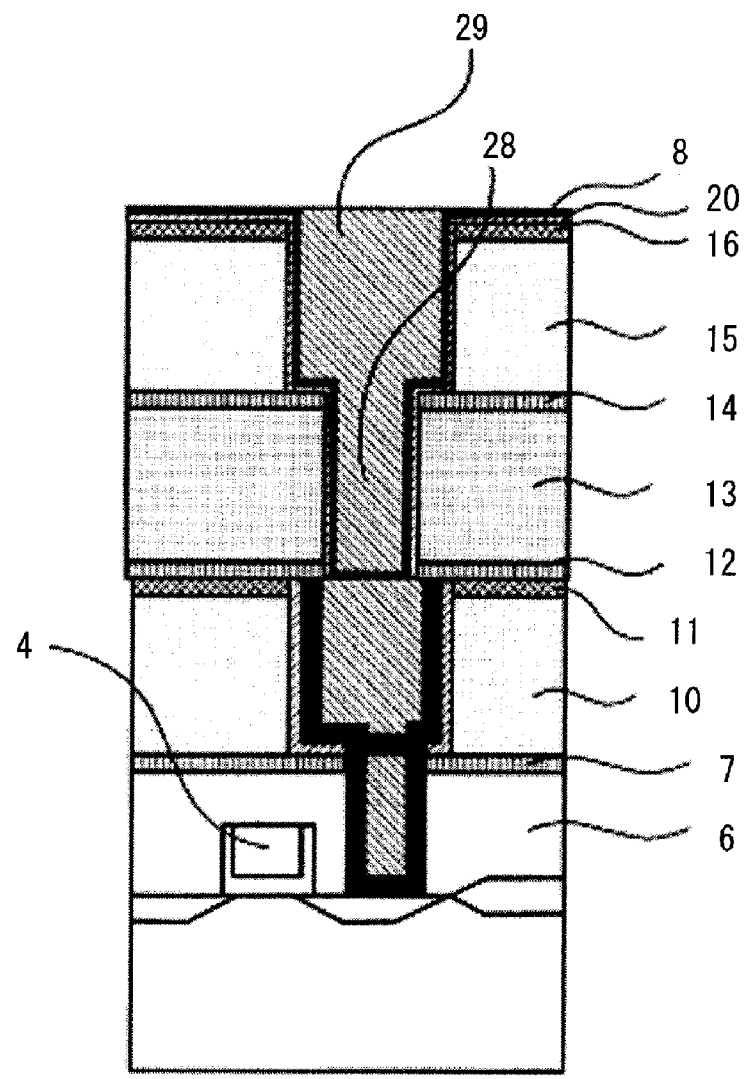
FIG. 10 is a schematic (cross-sectional) view of fabrication process in an example of multilayer wiring according to the present invention according to the present invention.

Embodiments of the invention are described below using diagrams, tables and examples. These diagrams, tables, examples and the description serve to illustrate the present invention, but are not intended to limit the scope of the invention. It is to be understood that other embodiments may fall within the purview of the present invention insofar as they are in keeping with the spirit of the invention. In the diagrams, like symbols represent like elements.

In the present invention, "surface-hydrophobicized film" refers to a film which is in a state of contact with a given layer and which, at the time of contact, has a surface with a lower moisture adsorptivity than the side of the layer with which it is in contact. Also, in the present invention, "hydrophobicized" does not necessarily mean that the subject is "hydrophobic," and is merely a relative expression. In this sense, there are instances where "surface-hydrophobicized film" could be rephrased as "surface hydrophilicity-reduced film."

The moisture adsorptivity may be specifically evaluated by holding samples of the same size (length, width, thickness) in a steady state at 50% humidity, then comparatively observing the amount of moisture desorption measured using a temperature desorption spectroscopy (TDS).

The contacting surface of a "given layer" in actual use is the surface, just prior to contact, on the side that comes into contact with a "surface-hydrophobicized film." For example, after the subsequently described treatment accompanied by damage has been carried out on an insulating film, the resulting treated surface is a contacting surface if it then comes into contact with the "surface-hydrophobicized film." When tests are carried out with samples, the tests should be conducted on sample surfaces that have been subjected to treatment patterned after such treatment. By contrast, at the "surface of a surface-hydrophobicized film," what is of concern is the hydrophobicity of the surface on the side which does not come into contact with "the contacting surface of a given layer" in actual use. When tests are carried out with samples, the tests should be conducted on the free surfaces of films that have been created as models.

According to one aspect, the present invention provides a surface-hydrophobicized film which is in contact with an insulating film, and has a higher hydrophobicity than the insulating film at the time of the contact, and which is in contact, on an opposite side of the surface-hydrophobicized film, with wiring, and contains at least one atom selected from the group consisting of sulfur atoms, phosphorus atoms and nitrogen atoms.

The insulating film surface prior to formation of this surface-hydrophobicized film has a higher moisture adsorptivity than the moisture adsorptivity of the surface-hydrophobicized film surface on the opposite side of the insulating film. With the presence of such a surface-hydrophobicized film, the influence of moisture can be lowered more than by placing the wiring in direct contact with the surface of the insulating film, thus making it possible to minimize the deterioration in insulating film characteristics, such as a rise in the dielectric constant, and also enabling an excellent adhesion to be achieved between the insulating film and the wiring. As a result, a wiring layer having a low leakage current, a high EM resistance and a high TDDB resistance can be obtained. This in turn makes it possible to manufacture semiconductor devices having a low power consumption and a high reliability.

In this invention, the "surface-hydrophobicized film in contact with an insulating film, which surface-hydrophobicized film has a higher hydrophobicity than the insulating film at the time of contact and is in contact on an opposite side thereof with wiring" may have any spatial configuration, provided the layer construction is composed of, in order, insulating film/surface-hydrophobicized film/wiring. For example, when provided in a semiconductor device, the surface-hydrophobicized film may be oriented parallel, perpendicular, or in some other direction, relative to the plane of the semiconductor device substrate.

In cases where another layer is interposed between a given insulating film and a surface-hydrophobicized film, if that layer is functionally capable of acting as an insulating film, it may be thought of as the insulating film of the present invention. Similarly, in cases where another layer is interposed between given wiring and the surface-hydrophobicized film, if that layer has electrical conductivity and is functionally capable of acting as part of the wiring, it may be thought of as the wiring of the present invention. Therefore, when an electrically conductive barrier metal layer is present between the surface-hydrophobicized film and the wiring, this barrier metal layer may be thought of as part of the wiring. The barrier metal often includes at least one element selected from the group consisting of tantalum, tungsten, titanium, manganese and nickel.

If effects such as lowering the leakage current and increasing the EM resistance and the TDDB resistance can be achieved by satisfying the above arrangement, then it is thought that the effects of interposing a surface-hydrophobicized film have been attained.

Figure 11:
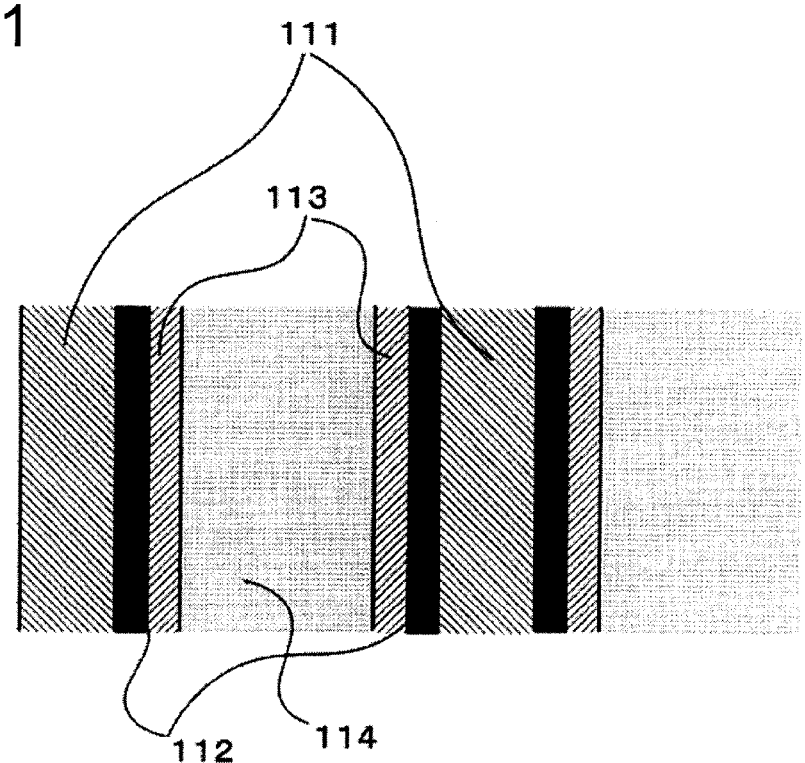
FIG. 11 is a schematic plan view of an insulating film/surface-hydrophobicized film/wiring structure.
Figure 12:
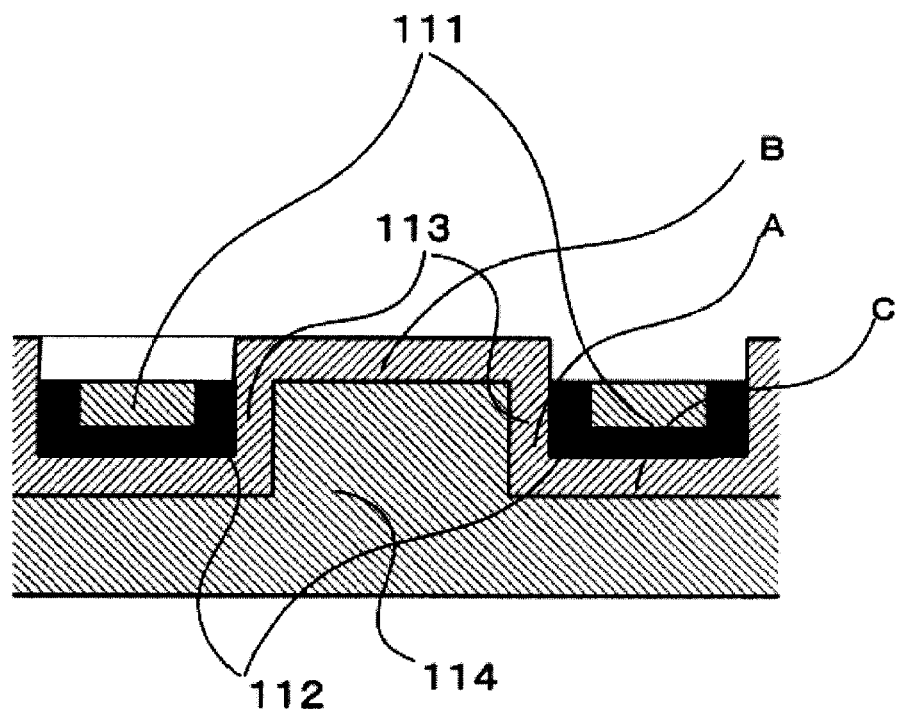
FIG. 12 is a schematic cross-sectional view from the side of an insulating film/surface-hydrophobicized film/wiring structure.

An example of an insulating film/surface-hydrophobicized film/wiring structure is shown in FIGS. 11 and 12. FIG. 11 is a plan view of an insulating film/surface-hydrophobicized film/wiring structure, and FIG. 12 is a cross-sectional view from the side of such a structure (in FIG. 11, the surface-hydrophobicized film on the insulating film is not shown). In FIG. 11, each wiring line 111 has on either side thereof a barrier metal layer 112, each barrier metal layer 112 has on either side thereof a surface-hydrophobicized film 113 according to the present invention, and each surface-hydrophobicized film 113 has on either side thereof an insulating film 114 with a damaged face. In FIG. 12, a wiring layer 111 is buried in the insulating film 114, and a surface-hydrophobicized film 113 is formed at positions A, B and C in the diagram.

Positions A and C are examples where a surface-hydrophobicized film according to the present invention is in contact with wiring on the side opposite to the side where it is in contact with an insulating film. At position B, a film corresponding to the surface-hydrophobicizing film has been provided on the insulating layer. By then providing wiring thereon, this film is able to function as a surface-hydrophobicized film according to the present invention. However, this is generally subjected to surface planarization by chemical mechanical polishing (CMP), resulting in the removal of position B proper. This example also illustrates a state in which a surface-hydrophobicized film has not been formed on the wiring layer 111 or the barrier metal layer 112.

The effects according to the present invention are achieved at positions A and C because, presumably, the surface of the surface-hydrophobicized film in contact with the wiring has a reduced amount of moisture compared with the surface of the insulating film when the insulating film and the wiring are in contact, thus making it possible to prevent an increase in the leakage current and a deterioration in the TDDB resistance due to moisture in the film. Also, the surface-hydrophobicized film of the present invention has an excellent adhesion to the wiring, which is believed to enhance the EM resistance.

This arrangement lowers the leakage current from the wiring. As a result, a wiring layer (e.g., a LSI wiring layer) having a high TDDB resistance and, owing to an increase in adhesion with the wiring, a high EM resistance can be achieved. This in turn makes it possible to manufacture semiconductor devices having a low power consumption and a high reliability. In the present invention, "wiring layer" refers to a layer which includes a wiring structure and, as shown in FIGS. 11 and 12, may be exemplified by layers which include elements other than wiring within the same plane (e.g., insulating film, surface-hydrophobicized film, barrier metal layer).

The insulating film in the present invention refers to a film used for the purpose of insulating between conductors, regardless of whether it is referred specifically as an "insulating film." Illustrative examples include any of the following in semiconductor devices: interlayer insulation films, wiring isolating insulation films and protective films for these films (e.g., stopper films for setting the endpoint of CMP). No particular limitation is imposed on the film thickness or the place of use.

The material used in the insulating film in the present invention is not subject to any particular limitation, and may be suitably selected from among known materials. However, because the present invention is particularly suitable for applications in which the line spacings are 1 μm or below, the use of a material capable of forming an insulating film having a low dielectric constant is preferred. A low-k insulating film having a specific dielectric constant of 2.7 or below is more preferred, and a low-k insulating film having a specific dielectric constant of 2.5 or below is even more preferred. Generally, when the insulating film has a specific dielectric constant smaller than about 2.7, the insulating properties and reliability tend to abruptly decrease, which is why the advantages of the present invention are especially useful.

Inasmuch as a low-k insulating film having a dielectric constant of 2.5 or below can be obtained by applying onto a substrate to be worked a liquid composition containing a silicon compound prepared by hydrolyzing one or a combination of organosilanes of formulas (5) to (8) below in the presence of a tetraalkylammonium hydroxide to form a film, heat treating the film of liquid composition applied onto the substrate at a temperature of at least 80° C. but not above 350° C., and firing the heat-treated film at a temperature above 350° C. but not above 450° C., the use of such an insulating film is preferred.

$$Si(OR^{11})_4 \tag{5}$$

$$X^1Si(OR^{12})_3 \tag{6}$$

$$X^2X^3Si(OR^{13})_2 \tag{7}$$

$$X^4X^5X^6SiOR^{14} \tag{8}$$

(where, $X^1$ to $X^6$ are each independently hydrogen, fluorine or a group comprising a group selected from the class consisting of $C_{1-8}$ alkyls, fluorinated alkyls, aryls and vinyls, all of which may be substituted; and $R^{11}$ to $R^{14}$ are each independently a group comprising a group selected from the class consisting of $C_{1-20}$ alkyls, $C_{2-20}$ alkenyls, alkynyls, alkylcarbonyls, alkenylalkyls and alkynylalkyls, and $C_{6-20}$ aryls, all of which may be substituted.

Compared with other low-k insulating films having comparable dielectric constants, the low-k insulating films thus obtained often have excellent mechanical strengths, insulating properties and reliability, and are able to contribute to the formation of wiring layers (e.g., LSI wiring layers) which have higher insulating properties and a higher reliability.

Materials which may be used in the wiring of the present invention are not subject to any particular limitation, and may be suitably selected from among known materials such as copper, aluminum, gold and platinum. Copper is especially preferred.

The surface-hydrophobicized film of the present invention is preferably provided following treatment accompanied by damage to the insulating film. Treatment accompanied by damage includes any type of treatment, so long as the surface incurs damage due to such treatment. Specific examples include insulating film material-removing operations such as etching and CMP.

Following such treatment, substances such as water adhere to the surface of the insulating layer, leading to, for example, an increase in the leakage current and a deterioration in the TDDB resistance due to moisture within the film, which may become a major cause of a decline in yield and reliability in semiconductor production. In such a case, by providing the surface-hydrophobicized film of the present invention, compared with a case in which a surface-hydrophobicized film is not provided and the insulating film and the wiring are in direct contact with each other, the amount of moisture in areas of contact with the wiring is lower and the leakage current from the wiring is smaller, enabling an LSI wiring layer having a high TDDB resistance to be obtained. As a result, semiconductor devices having a low power consumption and a high reliability can be manufactured.

In addition, the surface-hydrophobicized film of the present invention is a film which, by including at least one type of atom selected from the group consisting of sulfur atoms, phosphorus atoms and nitrogen atoms, has an excellent adhesion to the wiring compared with cases where there is no surface-hydrophobicized film and the insulating film and the wiring are in direct contact with each other. Accordingly, it was found that an LSI wiring layer having a high EM resistance can be obtained, thus making it possible to manufacture semiconductor devices having a high reliability. This is presumably due to the formation of polar groups or bonds having polarity by the sulfur atoms, phosphorus atoms and nitrogen atoms.

Because the polar groups or bonds having polarity created by sulfur atoms, phosphorus atoms and nitrogen atoms generally have a lower hydrophilicity than OH, their presence does not greatly increase the hydrophilicity of the surface-hydrophobicized film. In this sense, it is acceptable for sulfur atoms, phosphorus atoms or nitrogen atoms to be included in the insulating film of the present invention. However, although there is a difference in degree, because the sulfur atoms, phosphorus atoms and nitrogen atoms act to increase the dielectric constant of the system, it is preferable to set the concentrations of these in the insulating film below their concentrations in the surface-hydrophobicized film and thereby keep the dielectric constant in the insulating film and the surface-hydrophobicized film overall low while at the same time achieving a good adhesion with the wiring. That is, the total concentration of the sulfur atoms, phosphorus atoms and nitrogen atoms in the surface-hydrophobicized film is preferably higher than the total concentration of the sulfur atoms, phosphorus atoms and nitrogen atoms in the insulating film.

The concentration of sulfur atoms, phosphorus atoms and nitrogen atoms in the surface-hydrophobicized film according to the present invention is not subject to any particular limitation and may be suitably selected while taking into consideration, for example, the dielectric constant, the leakage current, the EM resistance and the TDDB resistance. However, it is generally preferable for the total concentration, expressed as the atomic composition, to be in a range of from 1 to 10 atom %. Below this range, the adhesion effects do not readily emerge, whereas above this range, the decrease in the dielectric constant has a tendency to become excessive. The total concentration, expressed as the atomic composition, is more preferably in a range of from 1 to 5 atom %.

The thickness of the surface-hydrophobicized film of the present invention may be set to any value based on the actual circumstances (more specifically, based on the degree to which the surface roughness and fine damage of the insulating film can be reduced). Generally, it is preferable for the average film thickness to be set in a range of from 0.1 to 50 nm. At less than 0.1 nm, an adhesion-strengthening effect is often not achieved. At thicknesses above 50 nm, significant further improvement is unlikely to occur. Moreover, there exists a possibility of undesirable effects, such as a rise in via resistance due to the burial of via holes, and a rise in the effective dielectric constant of the wiring layer.

Because the surface-hydrophobicized film of the present invention also functions as part of the insulating film, the material that forms the surface-hydrophobicized film is not subject to any particular limitations provided this film contains at least one type of atom from among sulfur atoms, phosphorus atoms and nitrogen atoms, and provided it fulfills the required functions as an insulating film. However, to readily achieve the required insulating properties (especially a low dielectric constant), it is preferable for the material to contain silicon and oxygen, and more specifically, an SiO skeleton.

Specifically, it is preferable that the material used to form the surface-hydrophobicized film be a material which includes a silicon compound that satisfies at least one of the condition of having an average molecular weight of 1000 or less and the condition of having 20 or fewer silicon atoms per molecule. The reason is that a surface-hydrophobicized film of the desired thickness can be more easily formed from such a material. At an average molecular weight greater than 1000 and/or a number of silicon atoms per molecule of more than 20, the surface-hydrophobicized film tends to be thicker and the dielectric constant tends to be larger, often diminishing other characteristics.

Preferred examples of such silicon compounds include those selected from the group consisting of organosilanes, organosilane hydrolyzates, organosilane condensates, and mixtures thereof. The organo groups in the organosilanes of the present invention include also, for example, OH and ether bonds, and in some cases may, as illustrated by the moieties $R^1$ to $R^6$ in formulas (2) to (4), include also sulfur atoms, phosphorus atoms and/or nitrogen atoms. In some cases, sulfur atoms, phosphorus atoms and/or nitrogen atoms may be included also in the moieties $X^1$ to $X^6$ in formulas (6) to (8).

Condensation products of these organosilanes are often prepared via hydrolysis. Such condensates are exemplified by dimers and oligomers, although the condensates do not always need to be specified. Known techniques may be suitably employed for hydrolysis and condensation.

When a surface-hydrophobicized film is provided on an insulating film by using these agents, the adhesive strength with the wiring can be enhanced and the moisture at the film surface can be reduced relative to the interface with an insulating film when there is no surface-hydrophobicized film. Accordingly, by forming wiring in contact with this free surface, the moisture content at the interface with the wiring decreases. In addition, fine damage can be repaired. Hence, by forming on this surface-hydrophobicized film wiring in any one of the arrangements A to C in FIGS. 11 and 12, it is possible to obtain "a surface-hydrophobicized film in contact with an insulating film, which surface-hydrophobicized film has a higher hydrophobicity than the insulating film at the time of contact, is in contact on an opposite side thereof with wiring, and contains at least one type of atom selected from the group consisting of sulfur atoms, phosphorus atoms and nitrogen atoms."

The surface-hydrophobicized film may be obtained by using a process such as CVD, sputtering, ion implantation, or a combination thereof. Alternatively, the surface-hydrophobicized film may be obtained by applying a surface-hydrophobicized film-forming material to contact an insulating film, then heat-treating the insulating film on which the surface-hydrophobicized film-forming material has been placed. Wiring is then formed in contact with this surface-hydrophobicized film. Heat treatment is preferably carried out between 80° C. and 500° C. for a period of between 0.5 minute and 180 minutes.

There are also cases where both the insulating film and wiring are exposed and, when the surface-hydrophobicized film-forming material is applied to contact the insulating film, the surface-hydrophobicizing film-forming material also ends up being applied to the wiring. However, because this material can easily be removed following subsequent baking or the like, or can easily be removed by rinsing, etc., it is unlikely that the material will interfere when the wiring layer is electrically connected with other conductors (e.g., vias). Hence, there is little concern over a rise in wiring resistance or via contact resistance.

This is because, when the surface-hydrophobicized film-forming material is applied to the surface of an insulating film that has been treated by etching or CMP, if an organosilane or the like is used as the insulating film, the surface-hydrophobicized film-forming material is able to react with silanol groups that form on the insulating film surface, enabling a strong film to form. At the same time, even when copper wire or the like is also present during application of the surface-hydrophobicized film-forming material, reactions do not arise with the copper or other wiring material, enabling the film-forming material to be easily removed. It is thus possible to selectively form a surface-hydrophobicized film on the insulating film.

The method of forming the surface-hydrophobicized film on the surface of the insulating film is not subject to any particular limitation. Any suitable known method may be selected for this purpose. Illustrative examples include such methods of application as spray coating, spin coating and vapor treatment. "Vapor treatment" refers herein to guiding a surface-hydrophobicized film-forming material onto the insulating film in the above-indicated state. Use may be made of any known method, such as one in which the system is evacuated and, if necessary, heated, and the surface-hydrophobicized film-forming material is entrained with a carrier gas.

Heat treatment following application of the material is preferably carried out in an oxygen-free atmosphere, such as a nitrogen atmosphere. To make it possible to prevent a rise in the dielectric constant of the surface-hydrophobicized film owing to the presence of oxygen or the like, it is more preferable to continue this oxygen-free atmosphere following application of the material for a suitable length of time up until the completion of heat treatment. The degree to which oxygen is excluded may be set as appropriate for the actual circumstances.

The surface-hydrophobicized film-forming material generally includes a solvent. The solvent may be a solvent which is present together with the organosilane, or it may be a solvent used in hydrolysis or condensation to be present together with the resulting hydrolyzate or condensation product.

The type of solvent is not subject to any particular limitation, and may be suitably selected from among known solvents. When use is made of a solvent which is a substance identical to an ingredient present in the product obtained by hydrolyzing the organosilane, further hydrolysis of the organosilane can be prevented. Moreover, further polymerization of the hydrolyzed organosilane can also be prevented. This is also advantageous in that subsequent recovery of the solvent is easy.

The total amount of organosilane, organosilane hydrolyzate and organosilane condensate is preferably not more than 5 wt. % of the surface-hydrophobicized film-forming material. This is because a thick surface-hydrophobicized film will form at high concentrations, making it impossible to achieve other desired characteristics in the wiring layer, such as a low dielectric constant. Aside from the combined amount of organosilane, organosilane hydrolyzate and organosilane condensate, other substances present in the surface-hydrophobicized film-forming material include solvents and by-products of hydrolysis or condensation.

The above organosilane includes at least one compound of any of formulas (2) to (4) below, and optionally includes a compound of formula (1) below.

$$Si(OR^7)_4 \quad (1)$$

$$R^1Si(OR^8)_3 \quad (2)$$

$$R^2R^3Si(OR^9)_2 \quad (3)$$

$$R^4R^5R^6SiOR^{10} \quad (4)$$

(where, $R^1$ to $R^{10}$ are each independently hydrogen, or a group comprising a group selected from the class consisting of $C_{1-20}$ alkyls which may be substituted, $C_{2-20}$ alkenyls, alkynyls, alkylcarbonyls, alkenylalkyls and alkynylalkyls all of which may be substituted, and $C_{6-20}$ aryls which may be substituted. If any of $R^1$ to $R^6$ is present in the at least one compound included, the at least one of $R^1$ to $R^6$ contains at least one atom selected from the group consisting of sulfur atoms, phosphorus atoms and nitrogen atoms).

These compounds may be easily modified to hydrolyzates, condensates or mixtures thereof. Hence, by using such compounds, hydrolyzates thereof, condensates thereof or mixtures of these, a surface-hydrophobicized film that confers the above effects can easily be produced.

Because the moieties $R^7$, $R^8$, $R^9$ and $R^{10}$ are removed from the system when the organosilane is hydrolyzed or condensed, even if they contain sulfur atoms, phosphorus atoms and nitrogen atoms, these substantially do not remain in the surface-hydrophobicized film that has been created. By contrast, the moieties $R^1$ to $R^6$ remain within the system and satisfy the condition of "a surface-hydrophobicized film which includes at least one type of atom selected from the group consisting of sulfur atoms, phosphorus atoms and nitrogen atoms."

In the foregoing description, the passage "if any of $R^1$ to $R^6$ is present in the at least one compound included, the at least one of $R^1$ to $R^6$ contains at least one atom selected from the group consisting of sulfur atoms, phosphorus atoms and nitrogen atoms" means that when, for example, only a compound of formula (2) is used, $R^1$ contains at least one atom selected from the group consisting of sulfur atoms, phosphorus atoms and nitrogen atoms; when a compound of formula (2) and a compound of formula (3) are used, at least one of $R^1$, $R^2$ and $R^3$ contains at least one atom selected from the group consisting of sulfur atoms, phosphorus atoms and nitrogen atoms; and when only a compound of formula (4) is used, $R^4$ or $R^5$ or $R^6$ contains at least one atom selected from the group consisting of sulfur atoms, phosphorus atoms and nitrogen atoms.

With regard to the compounds of formula (1), following film formation, because the moieties that ought to include sulfur, phosphorus or nitrogen no longer remain, a surface-hydrophobicized film according to the present invention cannot be created using only this compound. Therefore, in cases where a compound of formula (1) is used, it is always a necessary condition that at least one compound of any of above formulas (2) to (4) be included.

The form of the sulfur, phosphorus or nitrogen included in $R^1$ to $R^6$ is not subject to any particular limitation, so long as the sulfur, phosphorus or nitrogen remains in the surface-hydrophobicized film. Illustrative examples include —S—, —SH, —N— and —NR$_2$ (R being hydrogen, an alkyl group or a phenyl group), —PR$_3$ (R being hydrogen, an alkyl group or a phenyl group), —NCO, —HN(CO)N$_2$H, —PR$_3$ (R being hydrogen, an alkyl group or a phenyl group), —(PO)(OR)$_2$ (R being hydrogen, an alkyl group or a phenyl group) or (R) (PO$_2$—Na$^+$)O— (R being hydrogen, an alkyl group or a phenyl group). These groups all have a lower polarity than —OH. Therefore, the rise in the dielectric constant of the surface-hydrophobicized film and the influence on hydrophobicization can be minimized. Also, as polar groups, these are believed to contribute to adhesion with the wiring. In addition, such groups may include other bonds, such as ketone bonds.

Examples of compounds of formulas (1) to (4) are shown below. Structures in which unsaturated bonds have been introduced at methylene group linkages in the structures shown below may also be included as examples of compounds having formulas (1) to (4).

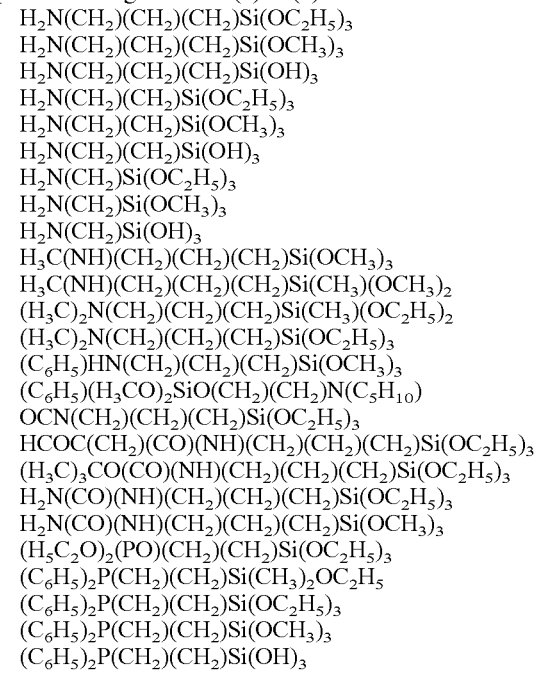

H$_2$N(CH$_2$)(CH$_2$)(CH$_2$)Si(OC$_2$H$_5$)$_3$
H$_2$N(CH$_2$)(CH$_2$)(CH$_2$)Si(OCH$_3$)$_3$
H$_2$N(CH$_2$)(CH$_2$)(CH$_2$)Si(OH)$_3$
H$_2$N(CH$_2$)(CH$_2$)Si(OC$_2$H$_5$)$_3$
H$_2$N(CH$_2$)(CH$_2$)Si(OCH$_3$)$_3$
H$_2$N(CH$_2$)(CH$_2$)Si(OH)$_3$
H$_2$N(CH$_2$)Si(OC$_2$H$_5$)$_3$
H$_2$N(CH$_2$)Si(OCH$_3$)$_3$
H$_2$N(CH$_2$)Si(OH)$_3$
H$_3$C(NH)(CH$_2$)(CH$_2$)(CH$_2$)Si(OCH$_3$)$_3$
H$_3$C(NH)(CH$_2$)(CH$_2$)(CH$_2$)Si(CH$_3$)(OCH$_3$)$_2$
(H$_3$C)$_2$N(CH$_2$)(CH$_2$)(CH$_2$)Si(CH$_3$)(OC$_2$H$_5$)$_2$
(H$_3$C)$_2$N(CH$_2$)(CH$_2$)(CH$_2$)Si(OC$_2$H$_5$)$_3$
(C$_6$H$_5$)HN(CH$_2$)(CH$_2$)(CH$_2$)Si(OCH$_3$)$_3$
(C$_6$H$_5$)(H$_3$CO)$_2$SiO(CH$_2$)(CH$_2$)N(C$_5$H$_{10}$)
OCN(CH$_2$)(CH$_2$)(CH$_2$)Si(OC$_2$H$_5$)$_3$
HCOC(CH$_2$)(CO)(NH)(CH$_2$)(CH$_2$)(CH$_2$)Si(OC$_2$H$_5$)$_3$
(H$_3$C)$_3$CO(CO)(NH)(CH$_2$)(CH$_2$)(CH$_2$)Si(OC$_2$H$_5$)$_3$
H$_2$N(CO)(NH)(CH$_2$)(CH$_2$)(CH$_2$)Si(OC$_2$H$_5$)$_3$
H$_2$N(CO)(NH)(CH$_2$)(CH$_2$)(CH$_2$)Si(OCH$_3$)$_3$
(H$_5$C$_2$O)$_2$(PO)(CH$_2$)(CH$_2$)Si(OC$_2$H$_5$)$_3$
(C$_6$H$_5$)$_2$P(CH$_2$)(CH$_2$)Si(CH$_3$)$_2$OC$_2$H$_5$
(C$_6$H$_5$)$_2$P(CH$_2$)(CH$_2$)Si(OC$_2$H$_5$)$_3$
(C$_6$H$_5$)$_2$P(CH$_2$)(CH$_2$)Si(OCH$_3$)$_3$
(C$_6$H$_5$)$_2$P(CH$_2$)(CH$_2$)Si(OH)$_3$ (C$_6$H$_5$)$_2$P(CH$_2$)Si(OC$_2$H$_5$)$_3$
(C$_6$H$_5$)$_2$P(CH$_2$)Si(OCH$_3$)$_3$
(C$_6$H$_5$)$_2$P(CH$_2$)Si(OH)$_3$
(H$_3$C)(PO$_2$—Na$^+$)O(CH$_2$)(CH$_2$)(CH$_2$)Si(OH)$_3$
HS(CH$_2$)Si(OC$_2$H$_5$)$_3$
HS(CH$_2$)Si(CH$_3$)(OC$_2$H$_5$)$_2$
HS(CH$_2$)Si(CH$_3$)$_2$OC$_2$H$_5$
HS(CH$_2$)Si(OCH$_3$)$_3$
HS(CH$_2$)Si(CH$_3$)(OCH$_3$)$_2$
HS(CH$_2$)Si(CH$_3$)$_2$OCH$_3$
HS(CH$_2$)(CH$_2$)Si(OC$_2$H$_5$)$_3$
HS(CH$_2$)(CH$_2$)Si(CH$_3$)(OC$_2$H$_5$)$_2$
HS(CH$_2$)(CH$_2$)Si(CH$_3$)$_2$OC$_2$H$_5$
HS(CH$_2$)(CH$_2$)Si(OCH$_3$)$_3$
HS(CH$_2$)(CH$_2$)Si(CH$_3$)(OCH$_3$)$_2$
HS(CH$_2$)(CH$_2$)Si(CH$_3$) OCH$_3$
HS(CH$_2$)(CH$_2$)(CH$_2$)Si(OC$_2$H$_5$)$_3$
HS(CH$_2$)(CH$_2$)(CH$_2$)Si(CH$_3$)(OC$_2$H$_5$)$_2$
HS(CH$_2$)(CH$_2$)(CH$_2$)Si(CH$_3$)$_2$OC$_2$H$_5$
HS(CH$_2$)(CH$_2$)(CH$_2$)Si(OCH$_3$)$_3$
HS(CH$_2$)(CH$_2$)(CH$_2$)Si(CH$_3$)(OCH$_3$)$_2$
HS(CH$_2$)(CH$_2$)(CH$_2$)Si(CH$_3$)$_2$OCH$_3$

Cases in which sulfur atoms, phosphorus atoms and/or nitrogen atoms are included in the moieties X$^1$ to X$^6$ of formulas (6) to (8) may be thought of in the same way as explained above for the moieties R$^1$ to R$^6$ in above formulas (2) to (4).

It is preferable that the above-described surface-hydrophobicized film-forming material have a pH of between 4 to 10 in the state in which it is used. Outside of this range, polymerization of the material will proceed to make the surface-hydrophobicized film that forms thicker, making it impossible to achieve other characteristics, such as a low dielectric constant, which are desired in the wiring layer. In cases where measurement of the pH is impossible, this condition cannot be employed. In general, however, because water or alcohol is present in the surface-hydrophobicized film-forming material, measurement of the pH is possible. The pH is measured at standard temperature.

Any process may be used as the method for manufacturing semiconductor devices using the surface-hydrophobicized film-forming material of the present invention, so long as the above conditions are satisfied. Specifically, it suffices for the process to include applying the above-described surface-hydrophobicized film-forming material to contact an insulating film on a semiconductor device, then heating the semiconductor device at a temperature of between 80° C. and 500° C. for a period of between 0.5 minute and 180 minutes to form a surface-hydrophobicized film. Here, the term "semiconductor device" includes also semiconductor devices in the process of being manufactured. Outside of the lower limits in these ranges, solidification or curing of the surface-hydrophobicized film may be inadequate. Outside of the upper limits in these ranges, further effects are often not achievable.

By including such a heating step, the reaction between the insulating film and the surface-hydrophobicized film-forming material is promoted, making it possible to further reduce the leakage current between conductors, increase adhesion with the wiring, and obtain a wiring layer having a higher reliability.

The presence of silanol groups in the insulating film is desirable because the reaction is further promoted. Moreover, for the reasons already mentioned, it is preferable for the insulating film to have incurred treatment that is accompanied by damage.

Preferred conditions for the method of application, the surface-hydrophobicized film-forming material, the film thickness, the atmosphere of the system at the time of application, the type of insulating film, the specific dielectric constant, etc. are as described above.

In this way, using the surface-hydrophobicized film-forming material according to the present invention, a "surface-hydrophobicized film having a high adhesive strength with wiring" can be formed, thereby making it possible to obtain a wiring layer having a low leakage current, a high EM resistance and a high TDDB resistance. Semiconductor devices having a low power consumption and a high reliability can be manufactured using such wiring layers. The present invention can be advantageously employed in highly integrated semiconductor devices such as integrated circuits (IC) and large-scale integration (LSI) chips.

The surface-hydrophobicized film-forming material according to the present invention, particularly when used in a process that includes the steps of, in order:

(I) forming semiconductor device wiring trenches and vias by etching,
(II) forming a surface-hydrophobicized film, and
(III) forming a barrier metal layer, can be advantageously employed in the actual manufacture of semiconductor devices and is thus effective. Specifically, the surface hydrophobicized film-forming material, in addition to enhancing the strength of adhesion with the wiring, is able to reduce moisture at the surface of the insulating film on the sidewalls of the wiring trenches formed by etching or within the insulating film, thus making it possible to form an LSI wiring layer having a smaller leakage current between conductors and a higher reliability.

EXAMPLES

Examples of the present invention and comparative examples are given below by way of illustration, but are not intended to limit the invention.

Example 1

To form an insulating film having a low dielectric constant, 200 mL of a solution containing the following compounds in the indicated proportions:

| | |
|---|---|
| Tetraethoxysilane | 20.8 g (0.1 mol) |
| Methyltriethoxysilane | 17.8 g (0.1 mol) |
| Glycidoxypropyltrimethoxysilane | 23.6 g (0.1 mol) |
| Methyl isobutyl ketone | 39.6 g | was charged into a reaction vessel, 16.2 g (0.9 mol) of an aqueous solution of 1% tetramethylammonium hydroxide was added dropwise for 10 minutes, and an aging reaction was carried out for 2 hours following the completion of addition. Next, 5 g of magnesium sulfate was added and excess moisture was removed, following which the ethanol that formed from the aging reaction was removed with a rotary evaporator until the volume of the reaction solution reached 50 mL. Next, 20 mL of methyl isobutyl ketone was added to the resulting reaction solution, thereby preparing a precursor coating solution of a coating-type low-k insulating material having a specific dielectric constant of 2.5.

This coating-type low-k insulating material was spin-coated onto a low-resistance substrate to a film thickness of 250 nm, pre-baked at 250° C. for 3 minutes, then cured in a N$_2$ atmosphere within an electric furnace at 400° C. for 30 minutes. The film thickness was measured and found to be 200 nm. In addition, plasma treatment from the top of the substrate was carried out in an $O_2$ atmosphere. This plasma treatment is a model of the "treatment accompanied by damage to the insulating film" according to the present invention.

Samples produced without carrying out any treatment in subsequent steps were designated as Sample 1; samples produced by spin-coating hexamethyldisilane (HMDS), then baking at 250° C. for 1 minute were designated as Sample 2; samples produced by spin-coating a film-forming material prepared by dissolving 1 wt. % of 1,3-dimethyltetraethoxy-disiloxane (DTDS) in ethanol and adjusting the average molecular weight to not higher than 1000, then baking at 250° C. for 1 minute were designated as Sample 3; samples produced by spin-coating a film-forming material prepared by dissolving 1 wt. % of bis(triethoxysilyl)methane (BTSM) in ethanol and adjusting the average molecular weight to not higher than 1000, then baking at 250° C. for 1 minute were designated as Sample 4; samples produced by spin-coating a film-forming material prepared by dissolving 1 wt. % of mercaptomethyltrimethoxysilane (MMTMS) in methanol and adjusting the average molecular weight to not higher than 1000, then baking at 250° C. for 1 minute were designated as Sample 5; samples produced by spin-coating a film-forming material prepared by dissolving 1 wt. % of N-methylaminopropyltrimethoxysilane (MAPTMS) in methanol and adjusting the average molecular weight not higher than 1000, then baking at 250° C. for 1 minute were designated as Sample 6; and samples produced by spin-coating a film-forming material prepared by dissolving 1 wt. % of diethyl phosphatoethyl triethoxysilane (DEPETES) in ethanol and adjusting the average molecular weight to not higher than 1000, then baking at 250° C. for 1 minute were designated as Sample 7. In addition, samples produced by similarly forming the above coating-type low-k insulating material to a film thickness of 200 nm and curing at 400° C. for 30 minutes, but not carrying out subsequent treatment were designated as Sample 8. Also, the system was held in a nitrogen atmosphere during aging treatment. Samples 5 to 7 are examples according to the present invention.

Using a metal mask, gold was vapor deposited to a film thickness of 100 nm onto the insulating film surface of each of above Samples 1 to 8, and the electrical field-current characteristics were measured. Table 1 shows the current densities J ($A/cm^2$) of the resulting films at 0.1 MV/cm and 1 MV/cm. Measurement of the field-current characteristics was carried out with a precision semiconductor parameter analyzer (4156C, Agilent Technologies). A lower current density can be thought of as signifying that the leakage current in an actual wiring layer becomes smaller.

On each of the above Samples 1 to 8, tantalum was deposited to a thickness of 20 nm, in addition to which an oxidation preventing film was formed thereon to a thickness of 200 nm. Adhesion strength measurements were then carried out at 20 points by the Sebastian method. The device known as a Sebastian Five manufactured by Quad Group was used for such measurement. Table 1 shows the number of areas where peeling occurred at the tantalum and insulating layer interfaces. Fewer areas of peeling may be regarded as signifying a higher EM resistance in the actual wiring layer.

From these results, it is apparent that, in Samples 5, 6 and 7, current density characteristics comparable with a case in which etching was not carried out (Sample 8) were achieved, and that a strong adhesion with the tantalum used in the barrier metal was obtained. Improvement was observed even in Sample 5. The reason HMDS, DTDS and BTSM did not impart good results in terms of adhesion strength is thought to be attributable to a decline in adhesion strength in spite of carrying out surface hydrophobicization.

Film-forming materials were prepared to average molecular weights of not higher than 1000 by respectively dissolving DTDS, BTSM, MMTMS, MAPTMS and DEPETES in ethanol to 1 wt. %. The films in Samples 3 to 7 had thicknesses of 5 nm. In Sample 2, a film did not form. The presence of a SiO skeleton in Samples 3 to 7 was confirmed by X-ray photoelectron spectroscopy.

Sample 5 was measured by energy-dispersive X-ray spectrometry (EDS), whereupon the detection intensity ratio for sulfur atoms in the surface-hydrophobicized film and in the low-k insulating film was found to be not smaller than 10.

Sample 6 was measured by energy-dispersive X-ray spectrometry (EDS), whereupon the detection intensity ratio for nitrogen atoms in the surface-hydrophobicized film and in the low-k insulating film was found to be not smaller than 20.

Sample 7 was measured by energy-dispersive X-ray spectrometry (EDS), whereupon phosphorus atoms were detected in the surface-hydrophobicized film, but phosphorus atoms were not detected in the low-k insulating film.

The number of silicon atoms per molecule in each of the film-forming material solutions was calculated from the molecular weights measured using gas permeation chromatography (GPC), and the numbers of silicon atoms in Samples 3 to 7 were found to be respectively 12, 11, 8, 7 and 5.

TABLE 1

| Sample No. | Material | J at 0.1 MV/cm | J at 1 MV/cm | Number of areas of peeling |
|---|---|---|---|---|
| 1 | none | $2 \times 10^{-7}$ | $7 \times 10^{-1}$ | 2 |
| 2 | HMDS | $2 \times 10^{-9}$ | $7 \times 10^{-8}$ | 15 |
| 3 | DTDS | $3 \times 10^{-9}$ | $3 \times 10^{-10}$ | 13 |
| 4 | BTSM | $1 \times 10^{-10}$ | $3 \times 10^{-10}$ | 16 |
| 5 | MMTMS | $1 \times 10^{-10}$ | $3 \times 10^{-10}$ | 1 |
| 6 | MAPTMS | $1 \times 10^{-10}$ | $3 \times 10^{-10}$ | 3 |
| 7 | DEPETES | $1 \times 10^{-10}$ | $3 \times 10^{-10}$ | 2 |
| 8 | no plasma treatment | $1 \times 10^{-10}$ | $3 \times 10^{-10}$ | 15 |

Example 2

FIGS. 1 to 10 show the fabrication process in examples of multilayer wiring according to the present invention. First, a silicon wafer 1 was prepared with a transistor layer on which was formed a gate electrode 4 isolated by an inter-element isolation film 2, and having a source diffusion layer 5a, a drain diffusion layer 5b and a sidewall insulating film 3 (Step 1). Next, an interlayer insulation film 6 (phosphorus glass) and a stopper film 7 were formed on the silicon wafer 1 (Step 2), then a contact hole 21 for leading out an electrode was formed (Step 3).

TiN 8 was formed in the contact hole to a thickness of 50 nm by sputtering (Step 4), following which a conductor plug 9 was buried by mixing $WF_6$ with hydrogen followed by reduction (Step 5), after which areas other than the vias 25 were removed by CMP (Step 6). Next, a low-k film (wiring isolating insulation film) 10 was formed to a thickness of 250 nm above the plane of the silicon wafer, following which 50 nm of TEOS—$SiO_2$ 11 was deposited as a protective film for the interlayer insulation film (Step 7).

Using a resist layer having a first layer wiring pattern as the mask, this film was etched with a fluorine plasma obtained from $CF_4/CHF_3$ gas as the starting material, thereby creating a wiring trench 22 (Step 8). In this wiring trench 22, treatment of Sample 5 from Example 1 was carried out and a surface-hydrophobicized film 12 was formed (Step 9).

In addition, a 50 nm film of TiN 8 which acts as a barrier metal for copper to the insulating film and a seed layer 23 (Cu, 50 nm) which acts as an electrode in electroplating were formed in the wiring trench by sputtering (Step 10). A 600 nm copper layer 17 was then deposited by electroplating (Step 11), following which metal in areas other than the wiring pattern was removed by CMP, thereby forming a wiring layer 24 (Step 12).

Next, a dual damascene process in which a via layer and a wiring layer are formed at the same time is described.

A 50 nm cap layer 19 (SiN) was formed on the first layer wiring layer in order to prevent copper diffusion, and a SIOC film 13 formed by plasma CVD was deposited thereon to a thickness of 250 nm. In the wiring layer portion, first a 50 nm SiN film 14 was formed as a stopper film by plasma CVD using silane and ammonia gas, then a low-k insulating film 15 was formed to a height of 400 nm above the plane of the silicon wafer, following which a 50 nm layer of $TEOS-SiO_2$ 16 was deposited as a protective film for the interlayer insulation film (Step 13).

Using as the mask a resist layer having a via pattern, the $SiO_2$ film 16/low-k insulating film 15/SiN film 14/SiOC film 13/cap layer 19 were etched in this order by varying the gas composition using a fluorine plasma prepared from $CF_4/CHF_3$ gas as the starting material (Step 14). Next, using as the mask a resist layer having a second layer wiring pattern, additional etching was carried out with a fluorine plasma prepared from $CF_4/CHF_3$ gas as the starting material (Step 15).

By carrying out the Sample 5 treatment in Example 1, a surface-hydrophobicized film 20 was formed in this via hole 30 and the wiring trench 26, and a 50 nm layer of TiN 8 which acts as the barrier metal for copper to the insulating film and a 50 nm seed layer 27 (Cu) which acts as an electrode during electroplating were formed by sputtering (Step 16). A copper layer 18 was deposited to a thickness of 1400 nm by electroplating (Step 17), following which metal in areas other than the wiring pattern was removed by CMP, thereby forming vias 28 and a wiring layer 29 (Step 18). The above steps were then repeated to form three-layer wiring. Using the resulting test-produced multilayer wiring, EM measurement of the vias was carried out at a current density of 1 MA (mega-amperes)/$cm^2$, but no defects arose even after 500 hours had elapsed.

Figure 13:
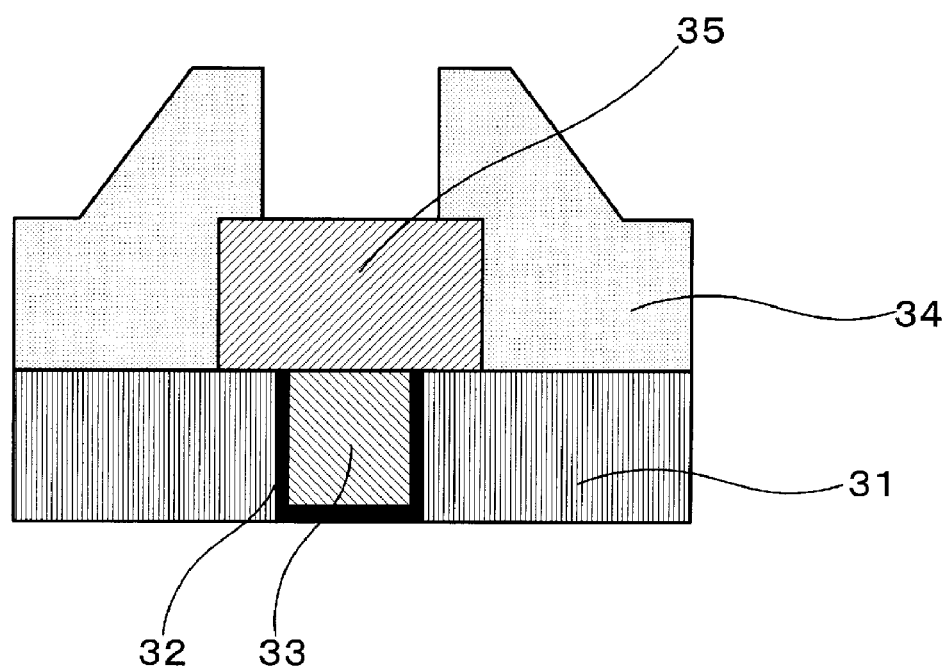
FIG. 13 is a schematic (cross-sectional) view of fabrication process of a semiconductor device according to the present invention.

Similar structures were additionally deposited on the above-described structure, thereby creating a multilayer wiring structure having a total of six layers. A structure composed of an insulating film ($SiO_2$, 500 nm; deposited by plasma CVD) 31 for an electrode pad contact layer, a TiN barrier layer 32, a tungsten-filled contact hole 33, a passivation film 34 and an electrode pad 35 were placed on the very top as shown in Step 19 of FIG. 13, thereby fabricating a semiconductor device.

Example 3

Aside from forming the surface-hydrophobicized layers 12 and 20 using Sample 6 in Example 1, three-layer wiring was produced in exactly the same way as in Example 2. Using the resulting test-produced multilayer wiring, EM measurement of the vias was carried out at a current density of 1 $MA/cm^2$, but no defects arose even after 500 hours had elapsed.

Example 4

Aside from forming the surface-hydrophobicized layers 12 and 20 using Sample 7 in Example 1, three-layer wiring was produced in exactly the same way as in Example 2. Using the resulting test-produced multilayer wiring, EM measurement of the vias was carried out at a current density of 1 $MA/cm^2$, but no defects arose even after 500 hours had elapsed.

Comparative Example 1

Aside from not forming the surface-hydrophobicized layers 12 and 20, three-layer wiring was produced in exactly the same way as in Example 2. Using the resulting test-produced multilayer wiring, EM measurement of the vias was carried out at a current density of 1 $MA/cm^2$. The median elapsed time until defects arose was 40 hours.

INDUSTRIAL APPLICABILITY

The present invention may be used in the manufacture of semiconductor devices having a low power consumption and a high reliability.

The invention claimed is:

1. A material for forming a surface-hydrophobicized film which is in contact with an insulating film, and has a higher hydrophobicity than the insulating film at the time of the contact, and which is in contact, on an opposite side of the surface-hydrophobicized film, with wiring, and contains at least one atom selected from the group consisting of sulfur atoms, phosphorus atoms and nitrogen atoms;

including a silicon compound that satisfies at least one of a condition of having an average molecular weight of 1000 or less and a condition of having 20 or fewer silicon atoms per molecule;

wherein the silicon compound is selected from the group consisting of organosilanes, organosilane hydrolyzates, organosilane condensates, and mixtures thereof; and wherein the organosilane includes at least one compound represented by any of formulas (2) to (4) below, and optionally includes a compound represented by formula (1) below:

$$Si(OR^7)_4 \qquad (1)$$

$$R^1Si(OR^8)_3 \qquad (2)$$

$$R^2R^3Si(OR^9)_2 \qquad (3)$$

$$R^4R^5R^6SiOR^{10} \qquad (4),$$

(where $R^1$ to $R^{10}$ are each independently hydrogen or a group comprising a group selected from the class consisting of $C_{1-20}$ alkyls which may be substituted, $C_{2-20}$ alkenyls, alkenyls, alkylcarbonyls, alkenylalkyls and alkynylalkyls all of which may be substituted, and $C_{6-20}$ aryls which may be substituted, with the proviso that if any of $R^1$ to $R^6$ is included in the at least one compound, the at least one of $R^1$ to $R^6$ contains at least one atom selected from the group consisting of sulfur atoms, phosphorus atoms and nitrogen atoms).

2. The surface-hydrophobicized film-forming material of claim 1, including a solvent that is a substance identical to a component present in a product obtained by hydrolyzing the organosilane.

3. A multilayer wiring structure comprising at least an insulating film and wiring layer,
the structure having, between the insulating film and the wiring layer, a surface-hydrophobicized film formed using the surface-hydrophobicized film-forming material of claim 1.

4. A semiconductor device comprising at least an insulating layer, a wiring layer, and a transistor,
the device having, between the insulating film and the wiring layer, a surface-hydrophobicized film formed using the surface-hydrophobicized film-forming material of claim 1.

5. A process for manufacturing a semiconductor device, comprising:
applying a surface-hydrophobicized film-forming material to contact an insulating film on a semiconductor device to form a film;
heating the applied film at a temperature of between 80° C. and 500° C. for a period of between 0.5 and 180 minutes to form a surface-hydrophobicized film;
wherein the material for forming a surface-hydrophobicized film which is in contact with the insulating film, has a higher hydrophobicity than the insulating film at the time of the contact, and which is in contact, on an opposite side of the surface-hydrophobicized film, with wiring, and contains at least one atom selected from the group consisting of sulfur atoms, phosphorus atoms and nitrogen atoms; and
wherein the insulating film is obtained by treatment which comprises applying to a substrate to be worked a liquid composition containing a silicon compound prepared by hydrolyzing one or a combination of organosilanes represented by formulas (5) to (8) below in the presence of a tetraalkylammonium hydroxide so as to form a film, heat treating the film formed of the applied liquid composition at a temperature of at least 80° C. but not higher than 350° C., and baking the heat-treated film at a temperature above 350° C. but not higher than 450° C.:

$$Si(OR^{11})_4 \quad (5)$$

$$X^1Si(OR^{12})_3 \quad (6)$$

$$X^2X^3Si(OR^{13})_2 \quad (7)$$

$$X^4X^5X^6SiOR^{14} \quad (8),$$

(where $X^1$ to $X^6$ are each independently hydrogen, fluorine, or a group comprising a group selected from the class consisting of $C_{1-8}$ alkyls, fluorinated alkyls, aryls and vinyls, all of which may be substituted; and $R^{11}$ to $R^{14}$ are each independently a group comprising a group selected from the class consisting of $C_{1-20}$ alkyls which may be substituted, $C_{2-20}$ alkenyls, alkenyls, alkylcarbonyls, alkenylalkyls and alkynylalkyls all of which may be substituted, and $C_{6-20}$ aryls which may be substituted).

6. The semiconductor device manufacturing process of claim 5, further comprising: performing etching or chemical mechanical polishing prior to the application of the surface-hydrophobicized film-forming material to the insulating film.

7. The semiconductor device manufacturing process of claim 6, wherein the insulating film is at least one of an interlayer insulation film and a protective film for the interlayer insulation film.

8. The semiconductor device manufacturing process of claim 5, wherein the insulating film has a specific dielectric constant of 2.7 or less.

* * * * *